United States Patent [19]
Toutounchi et al.

[11] Patent Number: 5,516,731
[45] Date of Patent: May 14, 1996

[54] HIGH-TEMPERATURE BIAS ANNEAL OF INTEGRATED CIRCUITS FOR IMPROVED RADIATION HARDNESS AND HOT ELECTRON RESISTANCE

[75] Inventors: Shahin Toutounchi, Pleasanton; Abraham Yee; Alexander H. Owens, both of Santa Clara; Michael Lyu, Saratoga, all of Calif.

[73] Assignee: LSI Logic Corporation, Milpitas, Calif.

[21] Appl. No.: 252,723

[22] Filed: Jun. 2, 1994

[51] Int. Cl.$^6$ ............................................. H01L 21/477
[52] U.S. Cl. ..................... 437/247; 437/171; 437/938; 437/57
[58] Field of Search ..................... 437/247, 170, 437/171, 156, 76, 51, 938, 928, 57; 257/921, 547

[56] References Cited

U.S. PATENT DOCUMENTS

| | | | |
|---|---|---|---|
| 3,691,376 | 9/1972 | Bauerlein et al. | 437/170 |
| 4,042,946 | 8/1977 | Sokoloski | 437/938 |
| 4,259,779 | 4/1981 | Ipri et al. | 437/906 |
| 4,288,911 | 9/1981 | Ports | 437/938 |
| 4,364,779 | 12/1982 | Kamgar et al. | 437/938 |
| 4,498,227 | 2/1985 | Howell et al. | 29/576 B |
| 5,220,192 | 6/1993 | Owens et al. | 257/519 |

FOREIGN PATENT DOCUMENTS

| | | | |
|---|---|---|---|
| 300922 | 9/1992 | Germany | 257/921 |

OTHER PUBLICATIONS

"Total Dose Radiation–Hardened Latch–Up Free CMOS Structures for Radiation–Tolerant VLSI Designs", by Hatano et al., IEEE Trans. Nucl. Sci., vol. NS-33, No. 6, 1986.

"Radiation–Tolerant 50MHz Bulk CMOS VLSI Circuits Utilizing Radiation–Hard Structure NMOS Transistors", by Hatano et al., IEEE Trans. Nucl. Sci. vol. NS-33, No. 5, 1986.

"Total–Dose Characterization of a High–Performance Radiation–Hardened 1.0–um CMOS Sea–of–Oats Technology", by Hama et al., IEEE Trans. Nucl. Sci. vol. 37, No. 6, Dec. 1990.

Primary Examiner—George Fourson
Assistant Examiner—S. Mulpuri
Attorney, Agent, or Firm—John P. Taylor

[57] ABSTRACT

A technique for improving the radiation hardness and hot-electron resistance of a CMOS integrated circuit is described whereby undesirable hydrogen ions may be vented through any holes, such as contact holes, in an overlying passivation layer by applying an elevated temperature and/or electrical bias to the integrated circuit die. The elevated temperature and electrical bias serve to accelerate the process by which hydrogen vents from the die. The elimination of unwanted hydrogen significantly reduces threshold shifts in the CMOS integrated circuit, providing greater radiation hardness and hot-electron resistance.

12 Claims, 2 Drawing Sheets

5,516,731

HIGH-TEMPERATURE BIAS ANNEAL OF INTEGRATED CIRCUITS FOR IMPROVED RADIATION HARDNESS AND HOT ELECTRON RESISTANCE

TECHNICAL FIELD OF THE INVENTION

The invention relates to semiconductor processing, and more particularly to fabrication and processing of radiation-hardened and hot electron resistant CMOS structures.

BACKGROUND OF THE INVENTION

Much of today's high-density integrated circuitry has been made possible by small-geometry CMOS (Complementary Metal Oxide Semiconductor) technology, well known to those skilled in the art of semiconductor processing. Most modern microprocessors and large-scale integrated circuits are made using small-geometry CMOS processes (2 micron line widths and below).

CMOS technology is particularly desirable in military and aerospace applications because of its high noise immunity and low power consumption. However, military and aerospace environments tend to be characterized by high levels of radiation, particularly electron and proton radiation, and standard CMOS circuits are known to have some problems with high-radiation environments. While it is possible to construct radiation shields for CMOS military applications, this tends to add weight, expense, and complexity; requires extensive testing; and negates much of the desirability of CMOS for these applications.

"Radiation hardness" refers to the ability of a semiconductor device to withstand radiation without alteration of its electrical characteristics. A semiconductor device is said to be radiation hardened (rad-hard), radiation tolerant, or radiation resistant if it can continue to function within specifications after exposure to a specified amount of radiation. Semiconductor devices can be damaged or destroyed by the effects of nuclear radiation from natural and man-made sources. Radiation changes the electrical properties of solid state devices, leading to possible failure of any system incorporating them.

Ionization is the principal agent that damages or destroys CMOS devices. It is caused by photon (gamma or X ray) interactions, fast neutron interactions, and charged (alpha and beta) particles.

As the dose of ionizing radiation increases, the number of carriers generated in silicon will increase. Out in space it might take many years for a device to absorb high levels of radiation. For example, it might take 20 years for an IC (integrated circuit) to absorb a total dose of 100,000 rads(Si). However, in the presence of a nuclear explosion, a device might reach this total dose within hundreds of nanoseconds. This type of pulse photon exposure is referred to as (extreme) transient radiation.

Particularly troublesome to CMOS devices in high radiation environments are active parasitic devices which occur within the CMOS devices themselves, particularly field isolation MOS ("field transistor", or "parasitic field transistor"; used interchangeably herein) and parasitic SCR (silicon controlled rectifier) structures. These structures are well known to those skilled in the art of semiconductor processing. NMOS (the n-channel part of the complementary pairs of transistors in CMOS structures) field transistor leakage and parasitic SCR latch-up are known to cause fatal (unrecoverable) misoperation of CMOS designs in high radiation environments. NMOS field transistor leakage is known to be induced by large negative threshold shifts in parasitic field transistors as a cumulative effect of radiation. This effect, being cumulative, permanently destroys the usefulness of CMOS devices over time as a function of the total dose of radiation received by the CMOS devices. (Numerous prior-art techniques are available for dealing with parasitic SCR structures, and are beyond the scope of this specification.)

Numerous radiation tolerant (rad-hard) designs of CMOS devices have been proposed and implemented. Typically, these designs are significantly larger and/or slower than their conventional CMOS counterparts. Since the NMOS transistors in CMOS structures are particularly sensitive to radiation effects, particularly field inversion in parasitic transistors, many techniques are aimed primarily at protecting only the NMOS transistors by such methods as building guard structures or guard rings into the n-channel devices which adjust the threshold of the parasitic transistors. Examples of such techniques for creating rad-hard CMOS devices and the characterization thereof are given in H. Hatano and Satoru Takatsuka, "Total Dose Radiation-Hardened Latch-up Free CMOS Structures for Radiation-Tolerant VLSI Designs", IEEE Trans. Nucl. Sci., vol NS-33, no. 6, 1986; and in commonly-owned U.S. Pat. No. 5,220,192 (issued Jun. 15, 1993).

These "guard" techniques provide significant improvement in total-dose radiation hardness, but can often require significantly more space than is required for their non-radiation-hard counterparts, and may increase the risk of N+/P- junction breakdown.

Other techniques which may be used to improve total-dose radiation hardness include:

1) Change the size of the island mask (used to control the size of the N+ source and drain diffusion "islands") to increase the spacing to the N+ diffusion. This technique has the disadvantage of dramatically increasing the size of the transistor, reducing overall circuit density, and is only partially effective.

2) Perform a blanket P- implant to adjust parasitic field transistor thresholds. This technique reduces field leakage, but increases parasitic capacitances (reducing the speed of the transistor), does not act as an additional field guard ring (increases risk of field inversion), and increases the risk of N+/P- junction breakdown.

3) Use a nitride passivation layer. This technique reduces field leakage, but increases CMOS threshold shifts (changes active characteristics of CMOS circuits), limiting total dose radiation tolerance.

4) Photo-implant a guard structure such as that described in commonly-owned U.S. Pat. No. 5,220,192. This technique provides good overall characteristics, but increases the risk of N+/P- junction breakdown, increases the transistor size slightly, and may be difficult, if not impossible to implement when smaller sub-micron geometries are employed.

As a final processing step, a passivation layer, typically nitride or oxide (or some combination thereof), is usually applied to CMOS integrated circuitry, which is then etched to expose the bond pads areas below. This passivation layer provides a moisture barrier, acts as an ion "getter" for contaminants and, in general, protects the integrated circuit against the outside environment during the assembly process.

It has been observed that nitride passivation reduces n-channel field leakage during total-dose radiation and is an excellent moisture barrier, but has a troubling side-effect.

Nitride passivation can cause CMOS threshold shifts due to a trapped charge phenomenon resulting from "interface state generation". As a result of this phenomenon, there is an increase in the resulting CMOS device's sensitivity to smaller total radiation doses. This interface state generation effect occurs as a result of the interaction of photon radiation with Si—H (silicon-hydrogen) bonds which occur as a natural result of nitride passivation. While the nitride passivation protects the n-channel transistors from field-effect leakage, this trapped charge effect reduces the radiation resistance of the p-channel and n-channel devices by causing substantial drive current and threshold shift degradation.

Oxide passivation, on the other hand, gives considerably lower CMOS threshold shifts, but does not protect the n-channel devices from radiation-induced field leakage and is not as good a moisture barrier as nitride.

"Hot" carriers, such as electrons or holes, affect CMOS devices in much the same way that radiation does, i.e., so-called "hole trapping" and interface state generation due to hot carrier impact, which causes degradation of CMOS devices in the form of mobility, drive current and threshold voltage degradation. High-energy electrons resulting from normal operation of an NMOS device strike the drain area of NMOS devices, creating trapped charge and interacting with hydrogen in the oxide to generate interface states similar to those produced by ionizing radiation. Unfortunately, since the source of hot electrons is internal to the CMOS device and is a product of normal operation of the device, the shielding methods used to provide radiation hardness are of little or no use against hot electrons. A key to reducing "hot electron" degradation is the removal of hydrogen from the gate dielectric.

"Hot Electron Resistance" is the capability of a CMOS device to withstand prolonged exposure to hot electrons. Traditional measures to improve hot-electron resistance involve structural modifications to CMOS devices to lessen susceptibility to CMOS threshold shifts. Examples of such techniques are: re-design of the CMOS drain structures making performance tradeoffs to favor hot electron resistance; operation of the CMOS device at reduced supply voltages to reduce the energy level of the electrons; of providing reduced hydrogen content through the use of plasma-CVD dielectric materials. These measures tend to degrade CMOS performance (slow), increase device size, add cost and complexity, and are generally hard to control. They are also difficult to accomplish with low-cost plastic packaging.

While neither oxide nor nitride passivation provides the combination of characteristics required for high total-dose radiation-hard CMOS circuitry, or good hot carrier resistance, the concept of using passivation to harden CMOS devices against radiation and hot carrier resistance is particularly attractive, since it requires virtually no additional circuit area, does not appreciably slow the circuitry, and is a relatively simple process.

The techniques of the prior art described hereinabove have been discussed with respect to CMOS devices, however, the problems of the prior apply equally to any semiconductor technology which incorporates MOS devices, including mixed technologies (e.g., bipolar and MOS transistors on the same semiconductor die).

SUMMARY OF THE INVENTION

It is therefore an object of the present invention to provide CMOS devices with improved radiation hardness and hot carrier resistance.

It is a further object of the present invention to provide a technique for reducing the amount of hydrogen and subsequently-generated interface states in a CMOS device.

It is a further object of the invention to provide rad-hard, hot electron resistant MOS circuits which operate at speeds comparable to those of conventional MOS circuits.

It is a further object of the invention to provide rad-hard, hot electron resistant MOS circuits without requiring additional circuit area.

According to the invention, a CMOS integrated circuit is prepared. Typically, this will include a nitride ($Si_xN_y$), oxide ($SiO_2$), or oxynitride ($SiO_xN_y$) passivation layer. Nitride passivation is an excellent diffusion barrier and would ordinarily prevent the escape of hydrogen ions, which are an essential ingredient in the generation of interface states which degrade CMOS device performance. However, by opening contact holes in the passivation layer (a normal and necessary step), a "vent" is provided through the nitride passivation layer. This vent path exists even in the presence of contact metal deposited in the contact holes. The normal process of diffusion of the undesirable hydrogen through the contact holes is extremely slow and, without assistance, provides no significant benefit. Application of elevated temperatures and/or electrical bias voltage to the CMOS integrated circuit dramatically accelerates the removal of the hydrogen ions through the contact holes.

In one embodiment of the invention, radiation hardened, hot-electron resistant CMOS integrated circuit dies are processed by fabricating one or more CMOS integrated circuit dies, each die having an overlying passivation layer, and holes formed through the passivation layer, and applying an elevated temperature to the integrated circuit dies for a period of time sufficient to permit hydrogen in the CMOS integrated circuit dies to be vented through the holes in the passivation layer.

In this particular embodiment, since only heat is applied, the holes in the passivation layer need not be contact holes.

In another similar embodiment, one or more CMOS integrated circuit dies are fabricated, each having a substrate, an overlying passivation layer, contact holes formed through the passivation layer, and metal contacts formed in the contact holes. An electrical bias is applied to the integrated circuit dies for a period of time sufficient to permit hydrogen in the CMOS integrated circuit die to be vented through the contact holes.

One aspect of the invention provides for the application of electrical bias to the integrated circuit dies alone or in combination with elevated temperature.

In another aspect of the invention, the electrical bias is applied to the integrated circuit dies by applying a first voltage to the metal contacts of each die and applying a voltage more positive than the first voltage to the substrate of each die.

Another aspect of the invention provides for applying electrical bias and/or elevated temperature to the integrated circuit dies for a pre-determined time, then testing a representative integrated circuit die for radiation hardness and/or hot-electron resistance. This process is repeated until sufficient radiation hardness and/or hot electron resistance are achieved.

The techniques of the present invention are described hereinbelow with respect to CMOS integrated circuits. However, CMOS is simply a commonly used MOS structure which is useful for descriptive purposes. These techniques are equally applicable to any semiconductor technology which incorporates MOS devices. For example, in a mixed technology which incorporates bipolar transistors and MOS transistors on the same semiconductor die, the techniques of the present invention may be applied to those areas of the dies where the MOS structures are located, with the same benefits as described for CMOS circuits.

Other objects, features, and advantages of the invention will become apparent in light of the following description thereof.

DETAILED DESCRIPTION OF THE INVENTION

Figure 1:
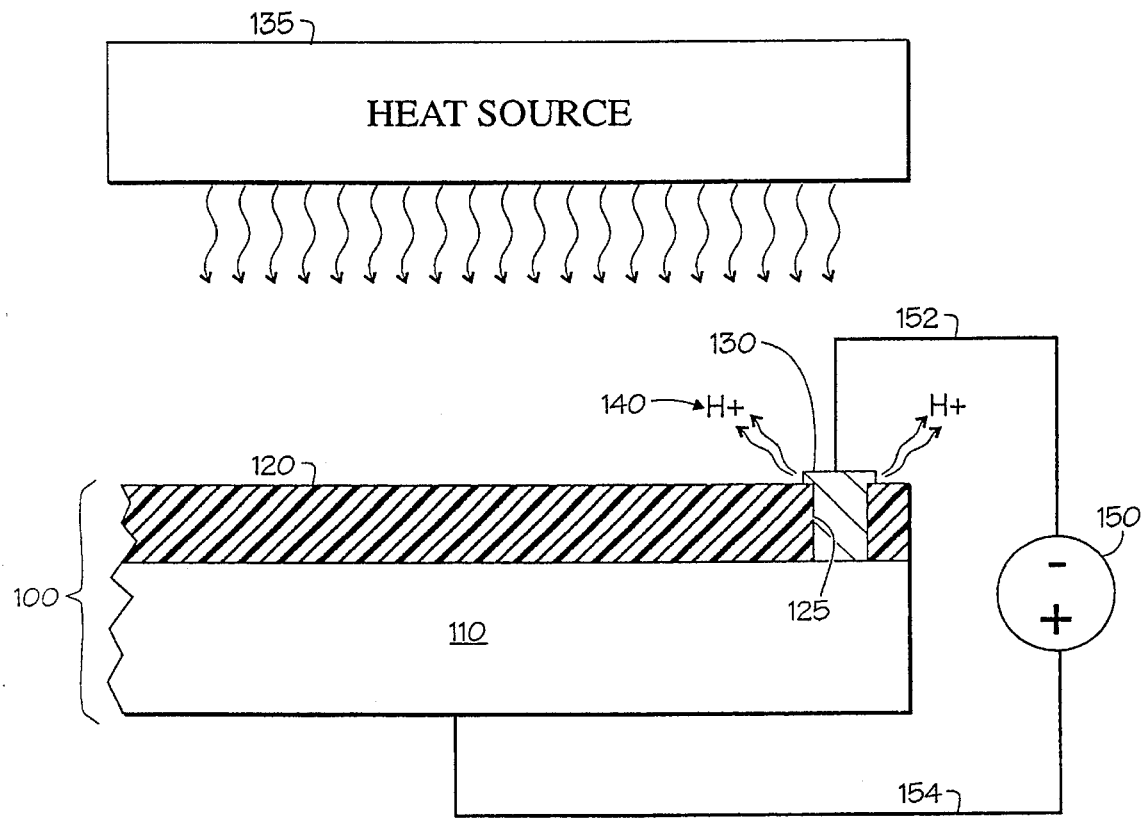
FIG. 1 is a cross-sectional view of a CMOS device being processed according to the present invention.

FIG. 1 is a cross-sectional view of a CMOS integrated circuit die 110 being processed according to the present invention. A CMOS substrate 110 with an overlying nitride ($Si_xN_y$), oxide ($SiO_2$), or oxynitride ($SiO_xN_y$) passivation layer 120 has a contact hole 125 opened in the nitride passivation layer, providing electrical access to circuitry formed within the CMOS substrate 110. A metal contact 130 is formed in the contact hole. An electrical field bias is applied to the CMOS integrated circuit die 100 by connecting a voltage source 150 via conductors 152 and 154 such that a lower voltage is applied to the metal contact 130 than is applied to the substrate 110. A heat source 135 applies heat (indicated by wavy arrows) providing an elevated temperature to the integrated circuit die 110. In the presence of the elevated temperature and electrical bias, the diffusion of hydrogen ions 140 is significantly enhanced, removing the unwanted hydrogen relatively rapidly.

The process of simultaneously applying an elevated temperature and an electrical bias is referred to hereinafter as a "high-temperature bias anneal" process. Application of the elevated temperature alone is referred to as a "high-temperature anneal" process.

Diffusion of hydrogen is enhanced, to a lesser degree, by the application of heat alone or a bias voltage alone. It is within the scope of the present invention to remove unwanted hydrogen by providing either elevated temperature alone (high-temperature anneal) or electrical bias alone.

By elimination of a significant portion of stray hydrogen ions, the generation of interface states is significantly reduced, providing both improved radiation tolerance and hot electron resistance.

This technique may be applied to a CMOS integrated circuit before or after dicing from a wafer, and before or after packaging. A packaged device need only be subjected to the same conditions as described for the dies. Electrical bias may be applied via the pins (leads or contacts) of the semiconductor device package.

The existence of the contact holes through the passivation layer provides a convenient vent path for the unwanted hydrogen, and the metal contacts are ideal for providing an electrical bias. However, any hole in the passivation layer would serve as a suitable vent in the presence of a high-temperature anneal. It is within the scope of the present invention to apply a high temperature anneal to a CMOS device having any kind of holes in an overlying passivation layer.

Figure 2:
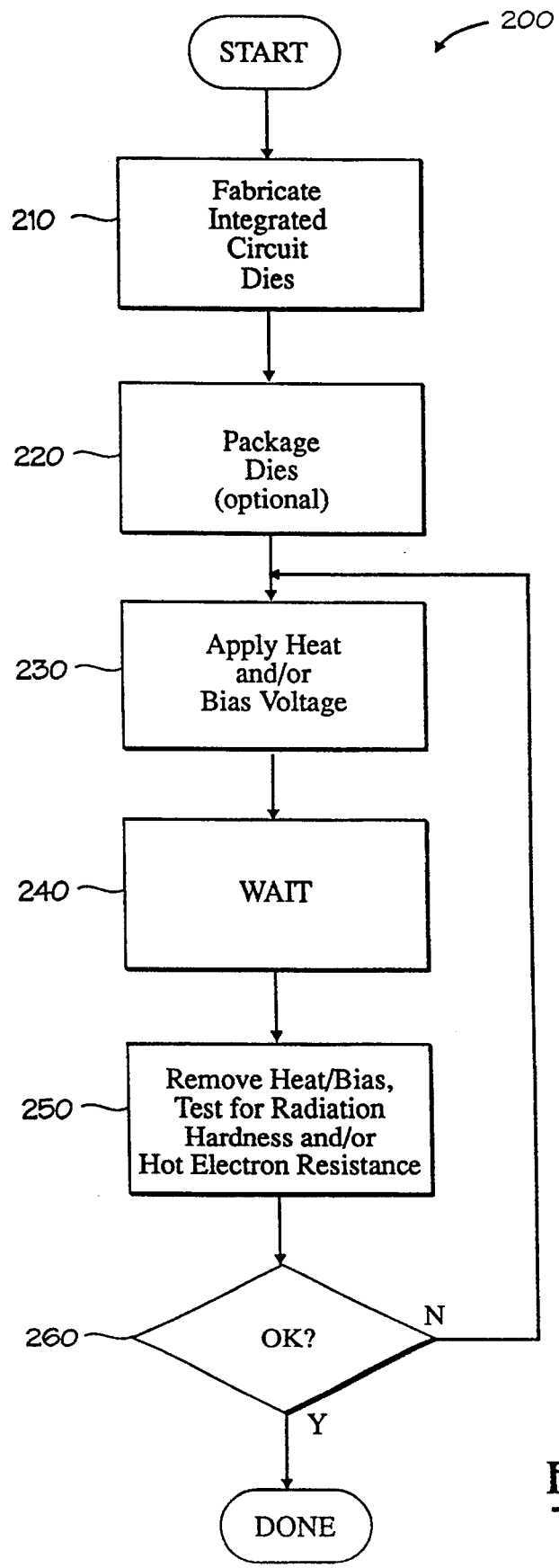
FIG. 2 is a flowchart showing a method for processing CMOS devices according to the invention.

FIG. 2 is a flowchart showing a method 200 for processing CMOS devices according to the invention. In a first step 210, CMOS integrated circuit dies are fabricated (typically on a wafer). In normal fashion, contact holes are formed through an overlying passivation layer and contact metal is deposited in the contact holes. In an optional second step 220, the integrated circuit dies may be packaged prior to treatment. In a third step 230, the dies are subjected to an elevated temperature (high-temperature anneal) and/or a bias voltage. In a fourth step 240, the heat/bias is maintained for a period of time. Preferably, this period of time is sufficient to permit hydrogen within the dies to vent from the holes in the overlying passivation layer, and can be empirically determined. In a fifth step, the heat/bias is removed and testing is done to determine the radiation hardness and/or hot-electron resistance of the processed CMOS integrated circuit dies. This is typically accomplished by destructive testing of one or more sacrificial dies. In a sixth step 260, it is determined whether the radiation hardness and/or hot electron resistance of the processed devices (as evidenced by the results of the testing in the fifth step 250) is sufficient (i.e., whether or not a sufficient amount of hydrogen has been driven from the processed CMOS integrated circuit dies). If the test results are favorable, the treatment process is complete. If the results are not favorable, the process returns to the third step 230 for further heat/bias applications. This process is repeated until sufficient radiation hardness and/or hot-electron resistance is demonstrated in the fifth step 250.

What is claimed is:

1. A method of making radiation hardened, hot-electron resistant CMOS integrated circuit dies comprising:

a) fabricating one or more CMOS integrated circuit dies;

b) forming over each of said integrated circuit dies an overlying passivation layer selected from the group consisting of silicon nitride and silicon oxynitride;

c) forming holes through said passivation layer to underlying portions of said CMOS integrated circuit dies; and d) removing hydrogen from said CMOS integrated circuit dies by venting said hydrogen through said holes in said passivation layer.

2. A method of making radiation hardened, hot-electron resistant CMOS integrated circuit dies comprising:

a) fabricating one or more CMOS integrated circuit dies;

b) forming over each of said integrated circuit dies an overlying passivation layer selected from the group consisting of silicon nitride and silicon oxynitride;

c) forming a plurality of holes through said passivation layer; and d) applying an elevated temperature and an electrical bias to said CMOS integrated circuit dies for a period of time sufficient to permit hydrogen in said CMOS integrated circuit dies to be vented through said holes in said passivation layer.

3. A method of making radiation hardened, hot-electron resistant CMOS integrated circuit dies comprising:

a) fabricating one or more CMOS integrated circuit dies;

b) forming over each of said CMOS integrated circuit dies an overlying passivation layer selected from the group consisting of silicon nitride and silicon oxynitride;

c) forming holes through said passivation layer; and d) applying an elevated temperature to the integrated circuit dies for a period of time sufficient to permit hydrogen in said CMOS integrated circuit dies to be vented through said holes in said passivation layer.

4. A method of making radiation hardened, hot-electron resistant CMOS integrated circuit dies, comprising:
   a) fabricating one or more CMOS integrated circuit dies, each having a substrate;
   b) forming over each of said CMOS integrated circuit dies an overlying passivation layer selected from the group consisting of silicon nitride and silicon oxynitride;
   c) forming contact holes through said passivation layer;
   d) forming metal contacts in said contact holes; and
   e) applying an electrical bias to the integrated circuit dies for a period of time sufficient to permit hydrogen in said CMOS integrated circuit dies to be vented through the contact holes.

5. A method of making radiation hardened, hot-electron resistant CMOS integrated circuit dies according to claim 4, further comprising:
   applying an elevated temperature to the integrated circuit dies along with the electrical bias.

6. A method of making radiation hardened, hot-electron resistant CMOS integrated circuit dies according to claim 5, wherein:
   the electrical bias is applied to the integrated circuit dies by applying a first voltage to the metal contacts of each die and applying a voltage more positive than the first voltage to the substrate of each die.

7. A method of making radiation hardened, hot-electron resistant CMOS integrated circuit dies according to claim 4, wherein:
   the electrical bias is applied to the integrated circuit dies by applying a first voltage to the metal contacts of each die and applying a voltage more positive than the first voltage to the substrate of each die.

8. A method of making radiation hardened, hot-electron resistant CMOS integrated circuit dies, comprising:
   a) fabricating a plurality of CMOS integrated circuit dies, each die having a substrate;
   b) forming over each of said integrated circuit dies an overlying passivation layer selected from the group consisting of silicon nitride and silicon oxynitride;
   c) forming contact holes through said passivation layer, and metal contacts in said contact holes; and
   d) repeating the steps of:
      i) applying an elevated temperature to the CMOS integrated circuit dies to permit hydrogen in said CMOS integrated circuit dies to be vented through said holes in said passivation layer; and
      ii) testing one or more of the CMOS integrated circuit dies for radiation hardness and hot electron resistance;
   until radiation hardness and hot electron resistance is achieved.

9. A method of making radiation hardened, hot-electron resistant CMOS integrated circuit dies according to claim 8, further comprising:
   applying an electrical bias to the CMOS integrated circuit dies along with the elevated temperature.

10. A method of making radiation hardened, hot-electron resistant CMOS integrated circuit dies according to claim 9, wherein:
    the electrical bias is applied to the integrated circuit dies by applying a first voltage to the metal contacts of each die and applying a voltage higher than the first voltage to the substrate of each die.

11. A method of making radiation hardened, hot-electron resistant CMOS integrated circuit dies, comprising:
    a) fabricating a plurality of CMOS integrated circuit dies, each die having a substrate;
    b) forming over each of said integrated circuit dies an overlying passivation layer selected from the group consisting of silicon nitride and silicon oxynitride;
    c) forming contact holes through said passivation layer;
    d) forming metal contacts in said contact holes; and
    e) repeating the steps of:
       i) applying an electrical bias to the CMOS integrated circuit dies to permit hydrogen in said CMOS integrated circuit dies to be vented through said holes in said passivation layer; and
       ii) testing one or more of the CMOS integrated circuit dies for radiation hardness and hot electron resistance;
    until radiation hardness and hot electron resistance is achieved.

12. A method of making radiation hardened, hot-electron resistant CMOS integrated circuit dies according to claim 11, wherein:
    the electrical bias is applied to the integrated circuit dies by applying a first voltage to the metal contacts of each die and applying a voltage higher than the first voltage to the substrate of each die.

* * * * *